(12) United States Patent
Hsieh

(10) Patent No.: US 8,872,571 B2
(45) Date of Patent: Oct. 28, 2014

(54) LEVEL SHIFTER AND OPERATIONAL AMPLIFIER

(71) Applicant: MStar Semiconductor, Inc., Hsinchu Hsien (TW)

(72) Inventor: Yi-Cheng Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/966,415

(22) Filed: Aug. 14, 2013

(65) Prior Publication Data

US 2014/0111267 A1 Apr. 24, 2014

(30) Foreign Application Priority Data

Oct. 19, 2012 (TW) .............................. 101138814 A

(51) Int. Cl.
*H03L 5/00* (2006.01)
*H03K 3/012* (2006.01)
(52) U.S. Cl.
CPC ....................................... *H03K 3/012* (2013.01)
USPC ........................................................ 327/333

(58) Field of Classification Search
USPC ........................................................ 327/333
See application file for complete search history.

(56) References Cited

U.S. PATENT DOCUMENTS

2013/0181762 A1* 7/2013 Wu et al. ....................... 327/333

* cited by examiner

*Primary Examiner* — Daniel Rojas
(74) *Attorney, Agent, or Firm* — Edell, Shapiro & Finnan, LLC

(57) ABSTRACT

A level shifter includes a signal receiving module, including at least one signal receiving end for receiving at least one input signal and being conducted or non-conducted according to the input signal; a level adjusting module, configured to generate the adjusted output signal according to the input signal, wherein the level adjusting module includes a first connection end and a second connection end, the second connection end is coupled to the signal receiving module; and a switch module, including a first end coupling to the first connection end and a second end coupling to the second connection end. If the switch module is conducted, an current path is formed between the first connection end, the second connection end and the signal receiving module through the switch module. If the switch module is not conducted, current is blocked from flowing from the first connection end to the second connection end.

10 Claims, 5 Drawing Sheets

LEVEL SHIFTER AND OPERATIONAL AMPLIFIER

CROSS REFERENCE TO RELATED APPLICATIONS

This application claims priority under 35 U.S.C. 119 to Taiwan patent application, TW101138814, filed on Oct. 19, 2012, the disclosure of which is incorporated herein by reference.

BACKGROUND OF THE INVENTION

1. Field of the Invention

The present invention relates to a level shifter and operational amplifier, and more particularly, to a level shifter and operational amplifier capable of turning down or off an internal switch and increasing output current quickly.

2. Description of the Prior Art

In traditional circuit design, a level shifter is used to adjust the voltage level of a signal for successive components' operation. For example, digital components operating on digital signals require a voltage level exceeding 1.2V for determining the logic value correctly. However, the voltage level of the original signal may be merely 250 mV. Therefore, a level shifter is required to adjust the voltage level for digital components' normal operation.

FIG. 1 depicts a diagram of a traditional level shifter 100. The level shifter 100 comprises a level adjusting module 101 and a signal receiving module 103. The signal receiving module 103 is configured to receive a differential input signal which comprises a first input signal $V_{in+}$ and a second input signal $V_{in-}$. The level adjusting module 101 generates an adjusted signal $V_o$ according to the differential input signal. The level adjusting module 101 comprises a first transistor $Tr_1$ and a second transistor $Tr_2$. A control end $T_{CTr1}$ of the first transistor $Tr_1$, a control end $T_{CTr2}$ of the second transistor $Tr_2$, and a second end $T_{2Tr2}$ of the second transistor $Tr_2$ are jointly coupled to a connection point T. The signal receiving module 103 comprises a first switch $SW_1$ and a second switch $SW_2$. A control end $T_{CSW1}$ of the first switch $SW_1$ and a control end $T_{CSW2}$ of the second switch $SW_2$ receive the first and the second input signal $V_{in+}$ and $V_{in-}$, respectively. Conductive status of the first switch $SW_1$ and the second switch $SW_2$ is determined according to the first and the second input signal $V_{in+}$ and $V_{in-}$, respectively.

In such a circuit design, the second transistor $Tr_2$ is always in a conducting state, i.e., current always flows through the second transistor $Tr_2$. FIG. 2 shows a diagram of current of the traditional level shifter. The horizontal axis represents time and the vertical axis represents current I flowing through the first switch $SW_1$ or the second switch $SW_2$. As shown in FIG. 2, the curve $C_I$ denoted by a dashed line represents an ideal value of current I, and the curve $C_R$ denoted by a line represents a real value of current I. In the ideal situation, the current I rises to a predetermined value Iw and drops to zero quickly. However, in a real situation, since the second transistor $Tr_2$ cannot be coupled to ground quickly, the voltage of the connection T cannot, as a consequence, fall to zero quickly. The current rises and falls slowly and the rising and falling time is delayed. Moreover, when the first $Tr_1$ is not conducting, a small amount of current still flows through the second transistor $Tr_2$ continuously. Because the rising and falling of current is slow and there is always current flowing through the second transistor $Tr_2$, the sum of current flowing through the first transistor $Tr_1$ and the second transistor $Tr_2$ (i.e., the hatched area shown in FIG. is large during one time unit. As is well-known to those ordinary skilled in the art, the power consumption of components is related to the sum of current flowing through the components. Hence, the power consumption of the level adjusting module 101 in the circuit design shown in FIG. 1 is large. In addition, the phenomena of delayed current rising and falling may also degrade the overall performance of the circuit design.

From the above it is clear that the prior art still has shortcomings. Thus, there is a need in the industry for a novel technique that solves the aforementioned problems.

SUMMARY OF THE INVENTION

One of objectives of the present invention is to provide a level shifter capable of turning down or off an internal switch and increasing output current quickly.

Another objective of the present invention is to provide an operational amplifier capable of turning down internal switch and increasing output current quickly.

One embodiment according to the present invention provides a level shifter configured for generating an adjusted output signal. The level shifter comprises a signal receiving module, comprising at least one signal receiving end for receiving at least one input signal and being conducted (i.e., in a conducting state) or non-conducted (i.e., in a non-conductive state) according to the input signal; a level adjusting module, configured to generate the adjusted output signal according to the input signal, wherein the level adjusting module comprising a first connection end and a second connection end, the second connection end is coupled to the signal receiving module; and a switch module, comprising a first end coupled to the first connection end and a second end coupled to the second connection end. If the switch module is conducted, a current path is formed between the first connection end, the second connection end and the signal receiving module through the switch module, and if the switch module is not conducted, current is blocked from the first connection end to the second connection end.

The structure of the embodiment is not limited to the level shifter. It can also be used in the context of an operational amplifier.

Based on the afore-mentioned embodiments, the transistors in the level adjusting module coupled to the switch module can be turn off, current provided by the level adjusting module can rise quickly to address the issues noted in connection with the prior art.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 3:
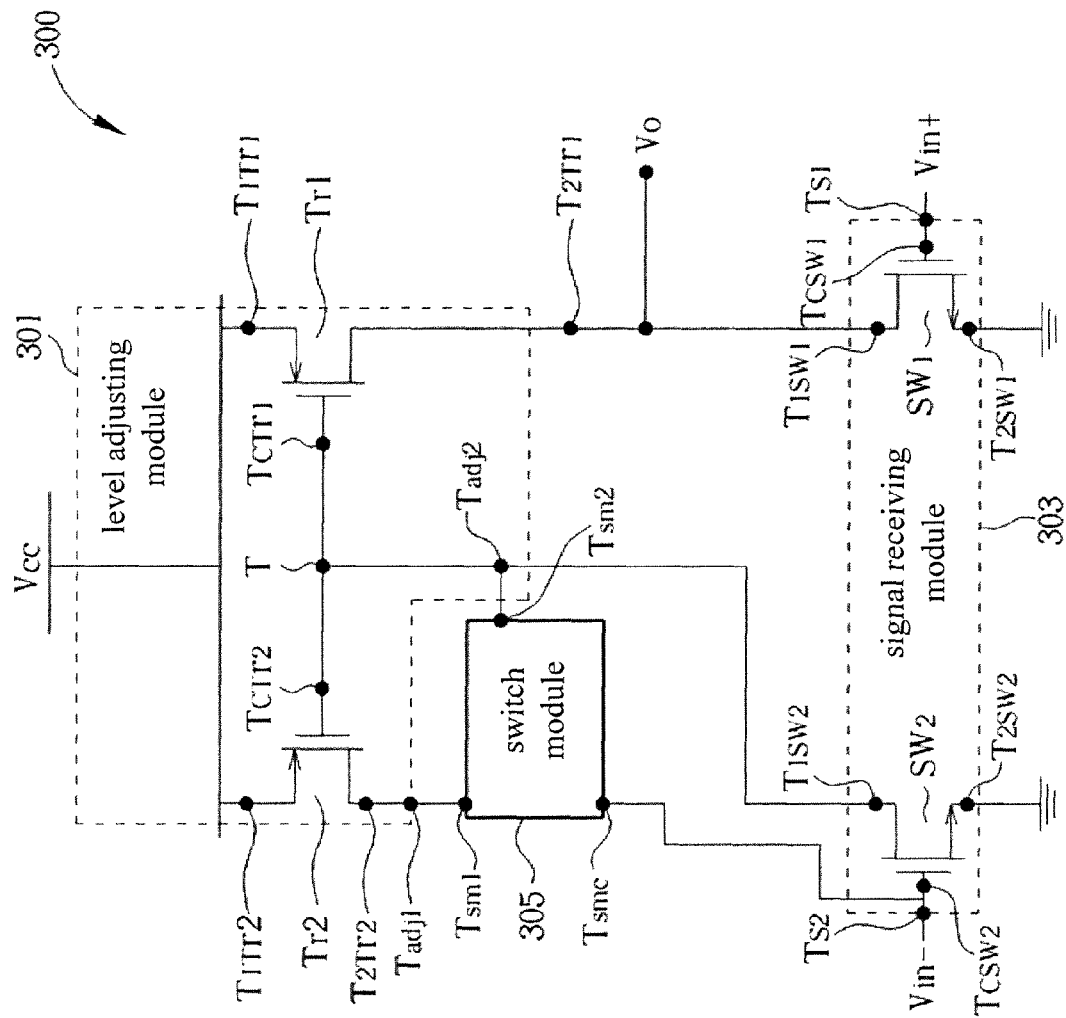
FIG. 3 illustrates a block diagram of a level shifter in accordance with an embodiment of the present invention.

FIG. 3 illustrates a block diagram of a level shifter 300 in accordance with an embodiment of the present invention.

Figure 1:
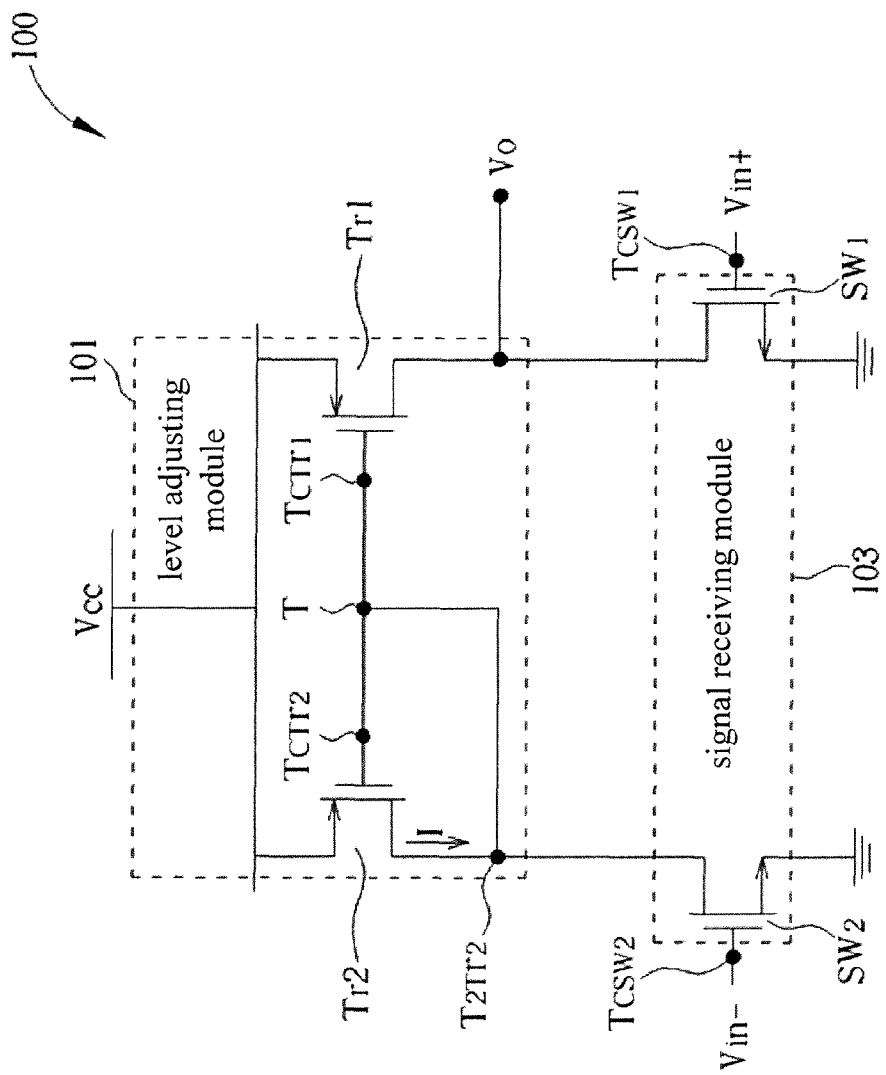
FIG. 1 depicts a diagram of a traditional level shifter.
Figure 2:
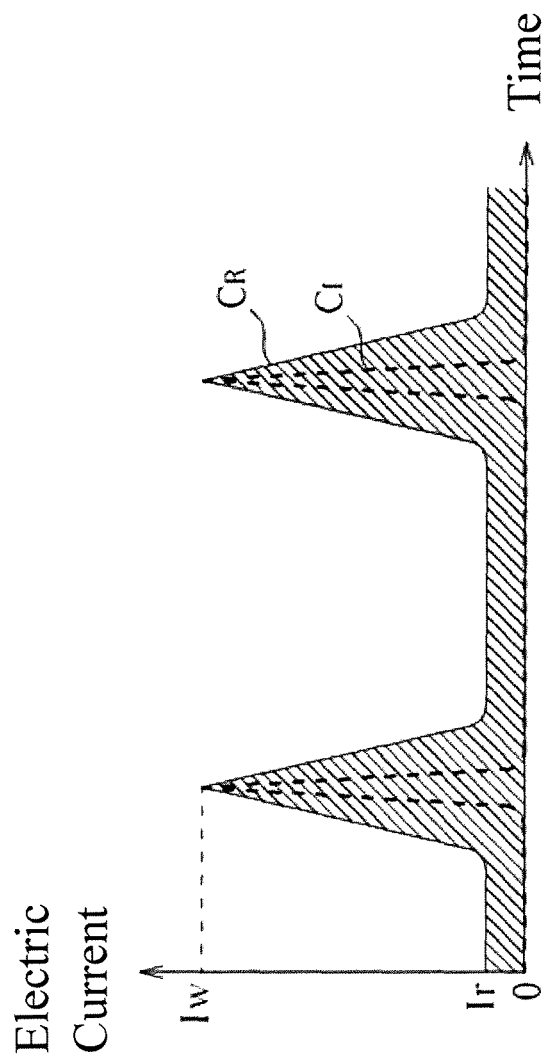
FIG. 2 shows a diagram of current of the traditional level shifter.
Figure 4:
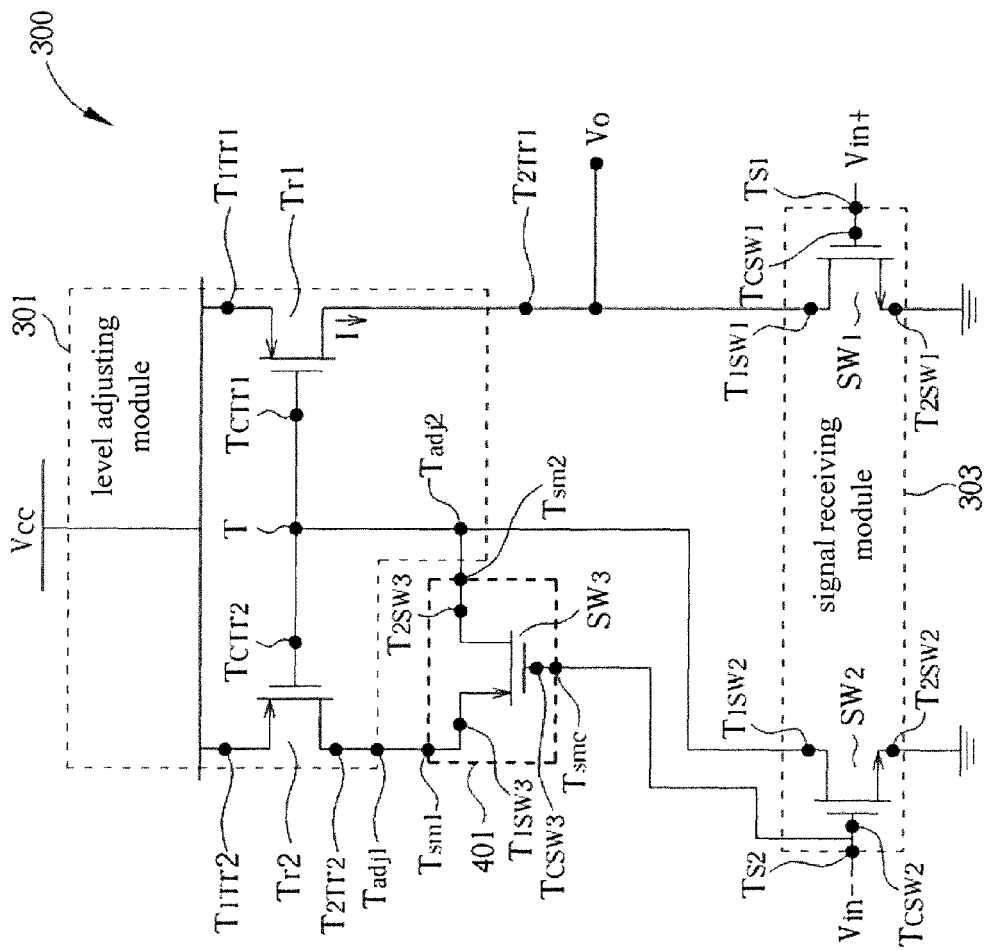
FIG. 4 illustrates a detail block diagram of a level shifter in accordance with one embodiment of the present invention.

Please be aware that although the embodiment shown in FIG. 3 takes circuit structure shown in FIG. 1 as exemplary basis, the present invention is not limited accordingly. The concept disclosed in the present invention can be applied to other circuit structures. For example, what the signal receiving module 303 shown in FIG. 3 receives is a differential signal. However, a single input signal is also applicable to the signal receiving module 303. In addition, the circuit designs shown in FIG. 3 and FIG. 4 are referred to as a level shifter. They could be utilized for other functions such as in connection with an operational amplifier.

As shown in FIG. 3, the level shifter 300 comprises a level adjusting module 301, a signal receiving module 303, and a switch module 305. The signal receiving module 303 comprises two signal input ends $T_{S1}$ and $T_{S2}$ for receiving a first and a second input signal $V_{in+}$ and $V_{in-}$, respectively. The level adjusting module 301 generates adjusted signal $V_o$ according to the first and second input signals $V_{in+}$ and $V_{in-}$. The level adjusting module 301 comprises a first connection end $T_{adj1}$ and a second connection end $T_{adj2}$ for coupling to the switch module 305 and the signal receiving module 303, respectively. The switch module 305 comprises a first end $T_{sm1}$ and a second end $T_{sm2}$ for coupling to the first connection end $T_{adj1}$ and the second connection end $T_{adj2}$, respectively. When the switch module 305 is conducted, a current path is formed between the first end $T_{sm1}$ and the second end $T_{sm2}$ of the switch module 305. In other words, current flows from the first connection end $T_{adj1}$ to the switch module 305 and passes through the second connection end $T_{adj2}$ to the signal receiving module 303 if the switch module 305 is conducted.

In one embodiment, the signal receiving module 303 comprises a first signal input end $T_{S1}$ for receiving the first input signal $V_{in+}$ and a second signal input end $T_{S2}$ for receiving the second input signal $V_{in-}$. In addition, the signal receiving module 303 further comprises a first switch component $SW_1$ and a second switch component $SW_2$. The first switch component $SW_1$ comprises a control end $T_{CSW1}$ as a first signal input end $TS_1$, a first end $T_{1SW1}$ for coupling the level adjusting module 301, and a second end $T_{2SW1}$ for coupling a first voltage level (ground level in this embodiment). The second switch component $SW_2$ comprises a control end $T_{CSW2}$ as a second signal input end $TS_2$, a first end $T_{1SW2}$ for coupling to the second connection end $T_{adj2}$ and the second end $T_{sm2}$ of the switch module 305, and a second end $T_{2SW2}$ for coupling to the first voltage level. If the second switch component $SW_2$ is conducted, the switch module 305 is not conducted. Conversely, if the second switch component $SW_2$ is not conducted, the switch module 305 is conducted. In this embodiment, a control end $T_{smc}$ of the switch module 305 also receives the second input signal $V_{in-}$ and whether the switch module 305 is conducted or not depends on the second input signal $V_{in-}$. However, the switch module 305 may be controlled by any signal other than the second input signal $V_{in-}$.

The level adjusting module 301 comprises a first transistor $Tr_1$ and a second transistor $Tr_2$. The first transistor $Tr_1$ comprises a control end $T_{CTr1}$ coupled to the second connection end $T_{adj2}$, a first end $T_{1Tr1}$ coupled to a second voltage level Vcc, and a second end $T_{2Tr1}$ coupled to the first end $T_{1SW1}$ of the first switch component $SW_1$. The second transistor $Tr_2$ comprises a control end $T_{CTr2}$ coupled to the second connection end $T_{adj2}$, a first end $T_{1Tr2}$ coupled to the second voltage level Vcc, and a second end $T_{2Tr2}$ coupled to the first connection end $T_{adj1}$.

FIG. 4ch illustrates a detail block diagram of a level shifter 300 in accordance with one embodiment of the present invention. In FIG. 4, a third transistor $SW_3$ functions as the switch module 305 shown in FIG. 3. Please be aware that the switch module 305 may comprise any other components in addition to the third transistor $SW_3$ and may be realized for performing equivalent functions by other components. A first end $T_{1SW3}$ of the third transistor $SW_3$ is analogous to the first end $T_{sm1}$ of the switch module 305 shown in FIG. 3. A second end $T_{2SW3}$ of the third switch component $SW_3$ is the same as the second end $T_{sm1}$ of the switch module 305 shown in FIG. 3. A control end $T_{CSW3}$ of the third switch component $SW_3$ is the same as the control end $T_{smc}$ of the switch module 305 shown in FIG. 3. The control end $T_{CSW3}$ is coupled to the control end $T_{CSW2}$ of the second switch component $SW_2$ for receiving the second input signal $V_{in-}$.

In the embodiment shown in FIG. 4, the first switch component $SW_1$ and the second switch component $SW_2$ are N-MOSFET (Metal Oxide Semiconductor Field Effect Transistor). And the first transistor $Tr_1$, the second transistor $Tr_2$, and the third switch component $SW_3$ are P-MOSFET. Hence, if the second switch component $SW_2$ is conducted (the second input signal $V_{in-}$ is at high voltage level), the third switch component $SW_3$ is not conducted. As a result, the voltage level of the connection point T can quickly fall to ground level such that the current flowing through the first transistor $Tr_1$ can rise quickly and the second transistor $Tr_2$ is not conducted. Conversely, if the second switch component $SW_2$ is not conducted (the second input signal $V_{in-}$ is at low voltage level), the third switch component $SW_3$ is conducted. As a consequence, a current path is formed between the first connection end $T_{adj1}$ and the second connection end $T_{adj2}$. Depending on the status of the first input signal $V_{in+}$, it is determined whether there is current outputted from the first transistor $Tr_1$.

Figure 5:
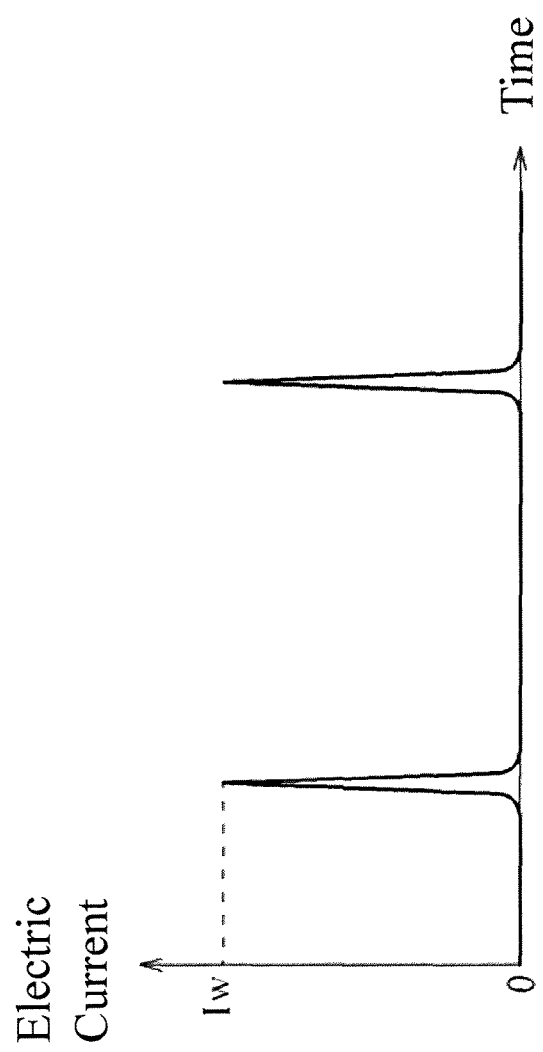
FIG. 5 illustrates a diagram of current in the level shifter in accordance with the present invention.

FIG. 5 illustrates a diagram of current of the level shifter in accordance with the present invention. As shown in FIG. 5, current I flowing through the first transistor $Tr_1$ can rise quickly. It is more efficient to provide large current to improve performance of the circuit design. Further, the second transistor $Tr_2$ can be turn off and be non-conducted. Therefore the current flow problem in the prior art due to the second transistor $Tr_2$ always being conducted is fully or at least substantially overcome.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A level shifter, configured to generate an adjusted output signal, comprising:
   a signal receiving module, comprising at least one signal receiving end for receiving at least one input signal and being conducted or non-conducted according to the input signal;
   a level adjusting module, comprising a first connection end and a second connection end coupled to the signal receiving module, and configured to generate the adjusted output signal according to the input signal; and
   a switch module, comprising a first end coupled to the first connection end, a second end coupled to the second connection end and a third end coupled to the input signal, wherein if the switch module is conducted, a current path is formed between the first connection end, the second connection end and the signal receiving module through the switch module, and if the switch module is not conducted, current is blocked from flowing from the first connection end to the second connection end;

wherein the switch module is controlled by the input signal.

2. The level shifter of claim 1, wherein the signal receiving module further comprises:
   a first signal input end for receiving a first input signal;
   a second signal input end for receiving a second input signal;
   a first switch component, comprising a control end as the first signal receiving end, a first end coupled to the level adjusting module, and a second end coupled to a first voltage level; and
   a second switch component, comprising a control end as the second signal input end, a first end coupled to the second connection end and the second end of the switch module, and a second end coupled to the first voltage level;
   wherein if the second switch is conducted, the switch module is not conducted, and if the second switch component is not conducted, the switch module is conducted.

3. The level shifter of claim 2, wherein the level adjusting module further comprises:
   a first transistor, comprising a control end coupled to the second connection end, a first end coupled to a second voltage level, and a second end coupled to the first end of the first switch component; and
   a second transistor, comprising a control end coupled to the second connection end, a first end coupled to the second voltage level, and a second end coupled to the first connection end.

4. The level shifter of claim 3, wherein the switch module further comprises:
   a third switch component, comprising a first end as the first end of the switch module, a second end as the second end of the switch module, and a control end coupled to the control end of the second switch component.

5. The level shifter of claim 4, wherein the first switch component, the second switch component and the third switch component are N-MOSFETs, and the first transistor and the second transistor are P-MOSFETs.

6. An operational amplifier, configured to generate an adjusted output signal, comprising:
   a signal receiving module, comprising at least one signal receiving end for receiving at least one input signal and being conducted or non-conducted according to the input signal;
   a level adjusting module, comprising a first connection end and a second connection end coupled to the signal receiving module, and configured to generate the adjusted output signal according to the input signal; and
   a switch module, comprising a first end coupled to the first connection end, a second end coupled to the second connection end and a third end coupled to the input signal, wherein if the switch module is conducted, an current path is formed between the first connection end, the second connection end and the signal receiving module through the switch module, and if the switch module is not conducted, current is blocked from the first connection end to the second connection end,
   wherein the switch module is controlled by the input signal.

7. The operational amplifier of claim 6, wherein the signal receiving module further comprises:
   a first signal input end for receiving a first input signal;
   a second signal input end for receiving a second input signal;
   a first switch component, comprising a control end as the first signal receiving end, a first end coupled to the level adjusting module, and a second end coupled to a first voltage level; and
   a second switch component, comprising a control end as the second signal input end, a first end coupled to the second connection end and the second end of the switch module, and a second end coupled to the first voltage level;
   wherein if the second switch component is conducted, the switch module is not conducted, and if the second switch component is not conducted, the switch module is conducted.

8. The operational amplifier of claim 7, wherein the level adjusting module further comprises:
   a first transistor, comprising a control end coupled to the second connection end, a first end coupled to a second voltage level, and a second end coupled to the first end of the first switch component; and
   a second transistor, comprising a control end coupled to the second connection end, a first end coupling to the second voltage level, and a second end coupled to the first connection end.

9. The operational amplifier of claim 8, wherein the switch module further comprises:
   a third switch component, comprising a first end as the first end of the switch module, a second end as the second end of the switch module, and a control end coupled to the control end of the second switch component.

10. The operational amplifier of claim 9, wherein the first switch component, the second switch component and the third switch component are N-MOSFETs, and the first transistor and the second transistor are P-MOSFETs.

* * * * *